United States Patent [19]

Arakawa

[11] Patent Number: 5,278,505
[45] Date of Patent: Jan. 11, 1994

[54] SELF-CANCELLING RF RECEIVE COIL USED TO DECOUPLE MRI TRANSMIT/RECEIVE RF COILS

[75] Inventor: Mitsuaki Arakawa, Hillsborough, Calif.

[73] Assignee: The Regents of the University of California, Oakland, Calif.

[21] Appl. No.: 808,771

[22] Filed: Dec. 17, 1991

[51] Int. Cl.$^5$ .................................................. G01R 33/20
[52] U.S. Cl. .................................... 324/322; 324/311; 324/313; 324/314
[58] Field of Search .............. 324/318, 322, 313, 311, 324/314

[56] References Cited

U.S. PATENT DOCUMENTS

| | | | |
|---|---|---|---|
| 4,649,348 | 3/1987 | Flugan | 324/318 |
| 4,703,274 | 10/1987 | Kaufman et al. | 324/318 |
| 4,739,271 | 4/1988 | Haase | 324/318 |
| 4,752,738 | 6/1988 | Patrick et al. | 324/318 |
| 4,782,298 | 11/1988 | Arakawa et al. | 324/322 |
| 4,839,595 | 6/1989 | Boskamp | 324/318 |
| 4,857,850 | 8/1989 | Mametsa et al. | 324/318 |
| 4,881,034 | 11/1989 | Kaufman et al. | 324/318 |
| 4,924,868 | 5/1990 | Krause et al. | 324/322 |
| 5,006,805 | 4/1991 | Ingwersen | 324/318 |

OTHER PUBLICATIONS

Journal of Magnetic Resonance 89.485–495 (1990)—"-Passive Decoupling of Surface Coils by Pole Insertion" by Hyde et al.
Magnetic Resonance in Medicine 3.157–163 (1986)—'-'Elimination of Coupling between Cylindrical Transmit Coils and Surface-Receive Coils for in Vivo NMR" by Bendall et al.
Book of Abstracts, vol. 2, Society of Magnetic Resonance in Medicine Sixth Annual Meeting and Exhibition Aug. 17–21, 1987 New York City USA.
"Patient Safety in Surface Coil MRI" Boskamp et al p. 916. Intrinsic Safety of Electronically Tuned and Decoupled Surface Coils p. 838. by Krause et al.
"A Simple Method for Electronically Detuning Receive-Only Surface Coils with Transmission Line During $B_1$ Excitation" p. 852 by Holland et al.
Book of Abstracts—vol. 2, Society of Magnetic Resonance in Medicine Eighth Annual Meeting and Exhibition Aug. 12–18, 1989 "Computer Modelling of Passive Decoupling Circuits" p. 958—by John van Heteren et al.

Primary Examiner—Michael J. Tokar
Assistant Examiner—Raymond Y. Mah
Attorney, Agent, or Firm—Nixon & Vanderhye

[57] ABSTRACT

In addition to the usual winding of an MRI RF receive coil, a second, opposite sense, winding is connected to the same pair of RF output terminals and linked to at least part of the same space as the first winding. One or more serially connected RF switches in the second winding selectively connect it in circuit only during transmission of NMR RF nutation pulses. Under these conditions, any transmitted RF fields linked to the first winding are also linked to the second winding. Accordingly, any induced RF currents flowing in the receive coil windings produce self-cancelling effects in the tissue being imaged (thereby reducing possible distortion of the desired transmit fields being used for NMR nutation purposes).

15 Claims, 6 Drawing Sheets

(AT LARMOR FREQUENCY)

FIG. 4a
(PRIOR ART)
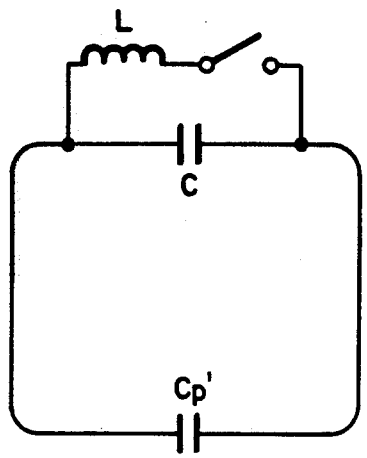
FIG. 4b
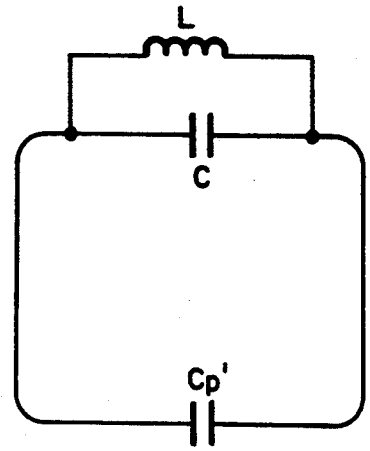
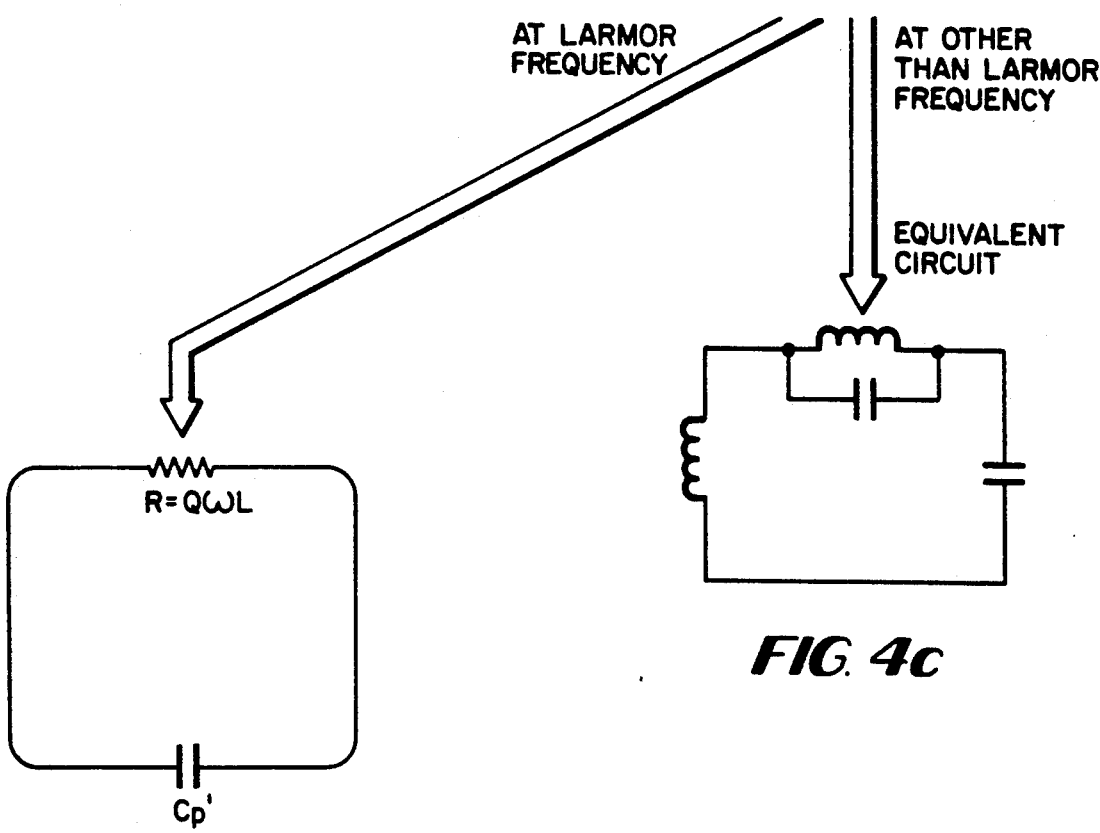
FIG. 4c
FIG. 4d
(AT LARMOR FREQUENCY)

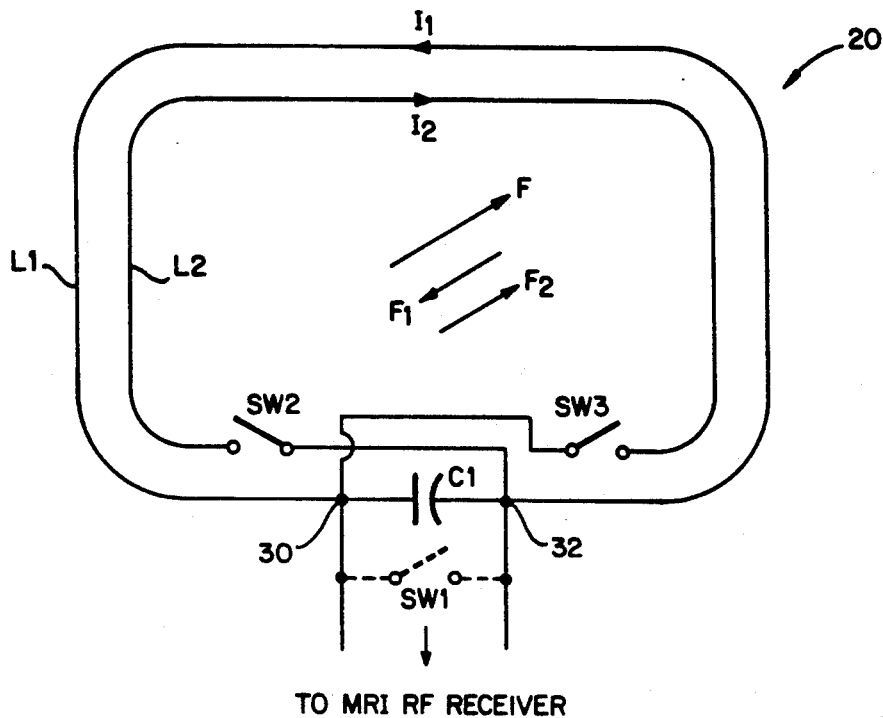
TO MRI RF RECEIVER
*FIG. 5*
*FIG. 6*
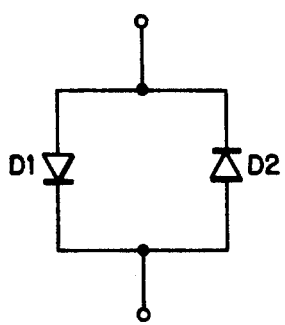
*FIG. 7*
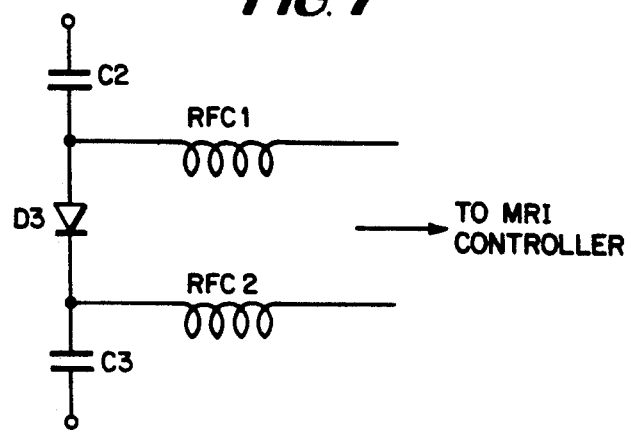

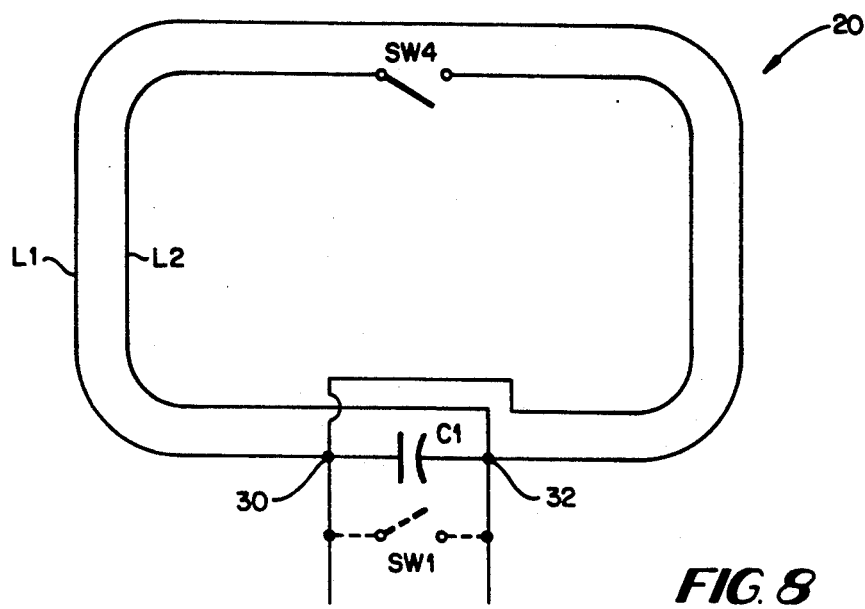
*FIG. 8*
*FIG. 9*
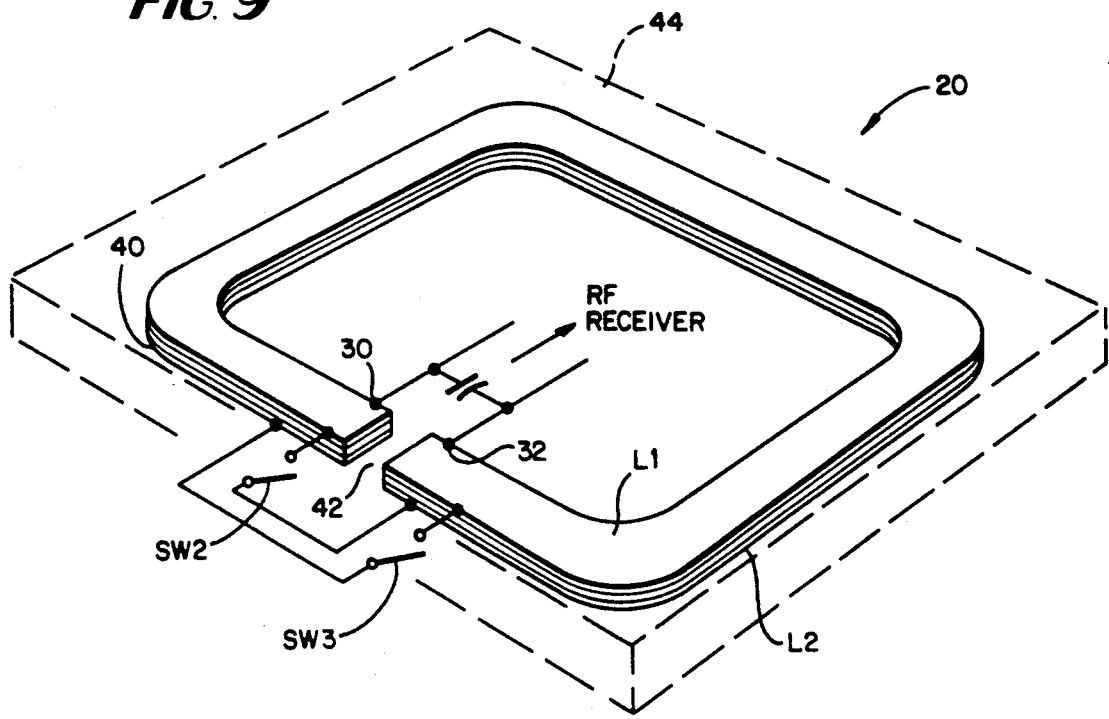

SELF-CANCELLING RF RECEIVE COIL USED TO DECOUPLE MRI TRANSMIT/RECEIVE RF COILS

This invention relates generally to magnetic resonance imaging (MRI) using nuclear magnetic resonance (NMR) phenomena. It is more particularly directed to method and apparatus associated with the MRI RF receiving coil used in an MRI system so as to produce self-cancelling fields during transmission of the NMR RF nutation pulses, thus more effectively decoupling the transmit and receive RF coils of an MRI system during RF transmit times.

Commercial MRI systems are now commonly available. In such systems, nuclei to be image (e.g., hydrogen nuclei within a human body) are located within an imaged volume in which a substantially uniform and homogeneous static magnetic field $B_o$ is maintained by a suitable magnetic field generator. Nuclei having net magnetic moments tend to align with the imposed static field. However, such alignment tendency is periodically disturbed in a controlled way by transmitting NMR RF nuclei nutation pulses (typically in conjunction with suitable pulsed magnetic field gradients) so as to elicit NMR RF signal responses from populations of NMR nuclei. As is well-known in the art, judicious selection of such NMR signalling sequences can extract MRI data useful in reconstructing an image of NMR nuclei populations within the imaged volume (e.g., along selected slice volumes, or the like).

In some MRI systems, one RF coil is used for transmitting required NMR RF nutation pulses while a second RF coil is used for receiving the NMR RF responses at a subsequent time. Ideally, such transmit and receive RF coils should be completely isolated from one another. In reality, however, during transmitted RF pulses there inevitably will be some linkage of the transmitted RF fields to the receive coil since both are physically associated with a common image volume. Due to Lenz' law and other electrical properties of the RF coil circuit, such linkage will necessarily induce currents in the receiver coil which, in turn, generate RF fields that oppose or enhance the desired transmitted RF fields. While it might at first appear that such unwanted RF fields would only oppose the desired transmitted field, in reality, we can sometimes observe a locally enhanced RF field near the receiver coil due to the usual detuning circuit (e.g., see L3, D1 and D2 in U.S. Pat. No. 4,703,274 - Kaufman et al). Such circuits can become capacitive at the Larmor frequency during the transmit periods and form part of a resonant circuit resonating at a higher frequency (e.g., $\sqrt{2}f_L$). In this way the phase of the induced RF field can be the same as that of the incident transmitted RF field thus producing an enhanced field near the receiver coil. If the receive coil is located relatively near an important part of the image volume (e.g., as when a surface coil is disposed substantially adjacent the spinal column for imaging the spinal column), it is possible for such induced fields to undesirably increase the effective nuclei nutation in that vicinity.

For example, some typical NMR sequences begin with a so-called 90° RF nutation pulse. As recognized by those in the art, the actual amount of nuclei nutation is a function of at least both the magnitude and duration of the applied NMR RF fields. Thus, although a 90° nuclei nutation is intended (and preferred for that particular NMR sequence), at locations near the receive coil a somewhat reduced or enhanced nuclei nutation may in fact be effected.

Of course, there are other reasons for wanting to decouple the RF receive coil from the RF transmit coil as well. For example, the sensitive RF receiver inputs might be damaged if subjected to the RF transmit fields (which are many times stronger than the received RF responses occurring at a later time).

Accordingly, there have been prior attempts to decouple RF receive and transmit coils in an MRI system. For example, as depicted in FIG. 2, a receive coil L1 and suitable tuning capacitance C1 are typically connected to a pair of RF output terminals (directed to the MRI RF receiver) across which is also connected a controlled shorting switch SW1. If an active RF switch SW1 is utilized, then it is suitably controlled by the MRI system controller. If a passive RF switch is used (e.g., a pair of back-to-back connected RF diodes), then it may automatically turn "on" when there are strong RF transmit fields linked to the receive coil L1. However, such shorting switch will still permit induced opposing or enhancing fields to distort desired nuclei nutation near the receive coil.

FIGS. 3a-3c and 4a-4d also depict prior art approaches. FIG. 3a depicts the circuit shown in more detail in U.S. Pat. No. 4,703,274 - Kaufman et al. FIG. 4 is a variation using an RF trap connected in series with the receiver coil.

The equivalent circuits for FIG. 3a are depicted in successive stages at FIGS. 3b-3e. Here, the de-tuning circuit satisfies the following equation at resonance:

$$\omega L_d = 1/[\omega C_p] \quad \text{(Equation 1)}$$

where $L_d$ equals the inductance L of the receive coil.

The equivalent circuits for FIG. 4a are depicted in successive stages at FIGS. 4b-4d. Here, the RF trap circuit satisfies the following equation:

$$\omega L_t = 1/[\omega C_t] \quad \text{(Equation 2)}$$

where: $C_T$ does not have to equal $C_P'$ and $L_T$ does not have to equal the inductance L of the receive coil. Rather, one chooses $C_T$ and $C_P'$ to satisfy the condition:

$$\omega L = 1/[\omega (C_t C_p')/(C_t + C_p')] \quad \text{(Equation 3)}$$

The FIG. 3 and 4 circuits work quite well in many circumstances and have been used commercially. If one could make the impedance $Z=Q\omega L_D$ or $Z=Q\omega L_T$ of the circuit so very high as to effectively become an open circuit during transmit mode, it may be quite good. However, achieving high impedance, which would provide a high degree of isolation between the transmit coil and the receive coil during the transmit period, requires an inductor and a capacitor with very high Q values. The high Q circuit requires very careful tuning adjustment to track the Larmor frequency changes. For example, the trap or the de-tune circuit whose Q is 300 will have a 3dB bandwidth of 50 KHz at 15 MHz Larmor frequency. Any Larmor frequency change of more than a few tens of KHz requires careful re-tuning.

With this invention, a further degree of decoupling can be achieved. In brief summary, this invention provides an additional winding, of opposite sense, to the RF receive coil and linked to substantially the same space as the regular RF receive coil. One or more RF switches in series with the second sense winding (preferably disposed symmetrically with respect to the common RF output terminals of the composite RF receive coil) are effective to connect the second sense winding in circuit at least during transmission of important NMR RF nutation pulses (while disconnecting the second sense winding during the regular RF receive times of the MRI sequence).

During RF transmit times, the two opposite sense windings are connected in parallel. Accordingly, induced currents in one coils will generate fields that tend to oppose the fields generated by induced currents in the other coil winding. The net result should be less effective coupling to the transmit coil (and less distortion of the desired degree of NMR nuclei nutation in the vicinity of the receive coil).

This invention will preserve the RF field near the receiver coil the same as the RF transmit field away from the receiver field without the need to have any additional tuning circuit (e.g. high Q inductor and capacitor) to adjust.

These as well as other objects and advantages of this invention will be more completely understood and appreciated by careful review of the following detailed description of presently preferred exemplary embodiments of this invention, taken in conjunction with the drawings, of which:

Figure 10:
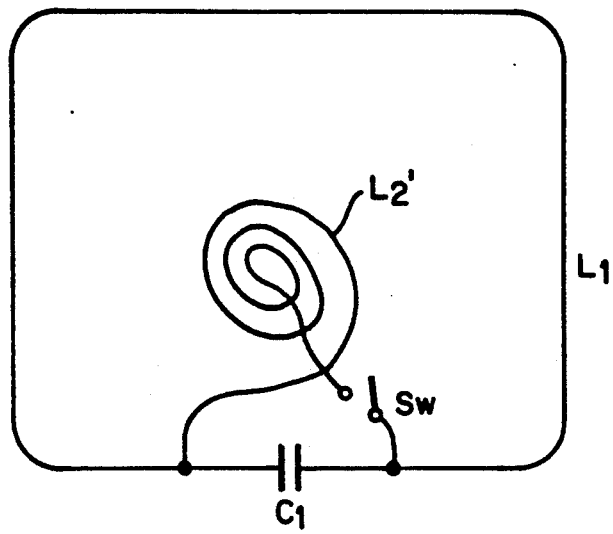
Figure 11:
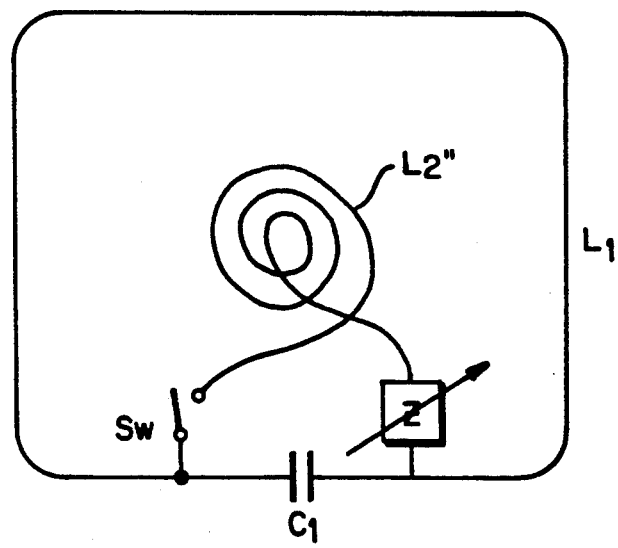

FIGS. 3a-3e schematic depictions of equivalent circuits for a certain prior art arrangement;

FIGS. 4a-4d are schematic depictions of equivalent circuits for yet a further prior art arrangement;

FIG. 5 is a schematic depiction of a first embodiment of a RF receive coil in accordance with this invention;

FIGS. 6 and 7 are schematic diagrams of passive and active switches, respectively, useful with this invention:

FIG. 8 is a schematic diagram of another exemplary embodiment of this invention;

FIG. 9 is a perspective view of one possible exemplary physical embodiment of this invention; and FIGS. 10 and 11 schematically depict alternate embodiments of the invention wherein the cancellation coil $L_2$ has different size, shape, area and/or turns than the receive coil $L_1$.

Figure 1:
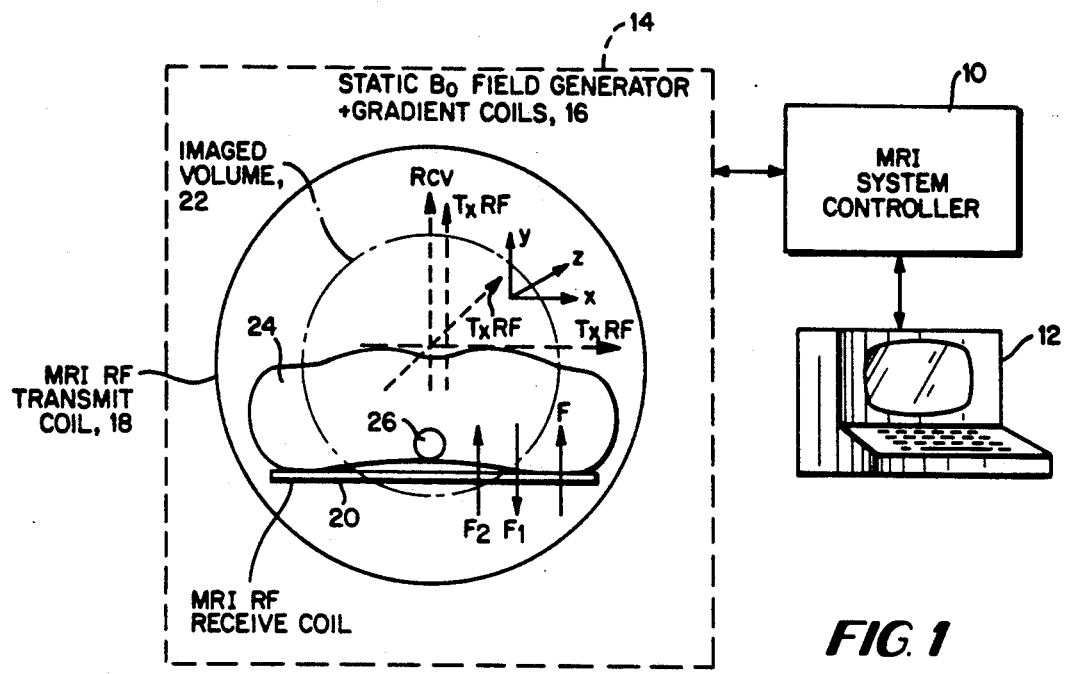
FIG. 1 is a schematic block diagram of a NMR system employing the improved MRI RF receive coil of this invention.
Figure 2:
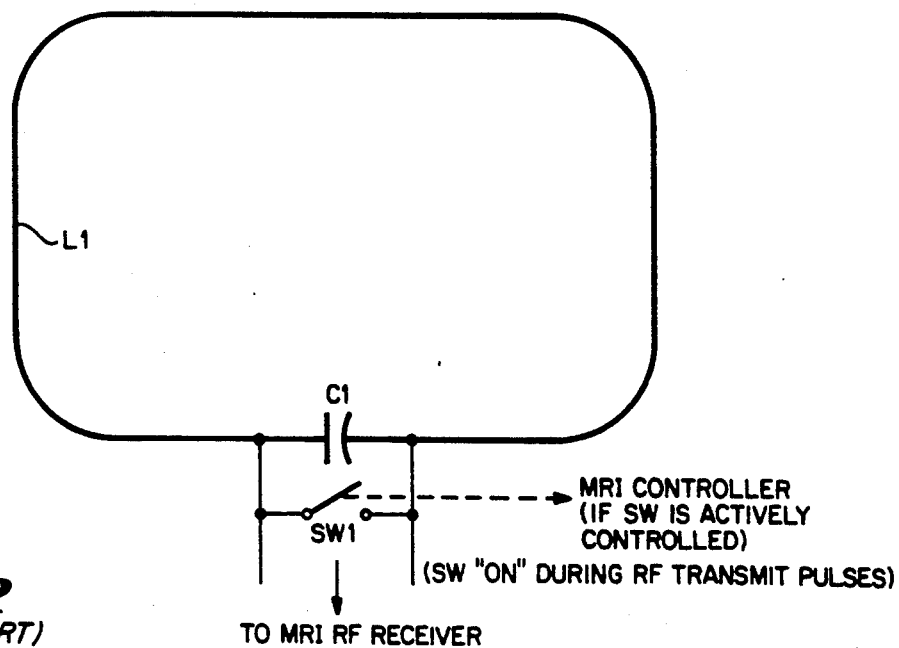
FIG. 2 is a schematic depiction of a prior art NMR RF receive coil.
Figure 3A:
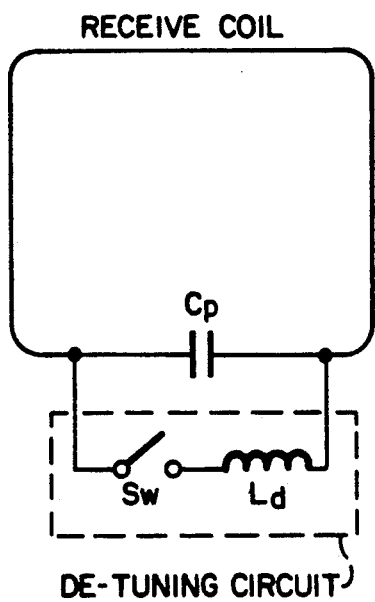
Figure 3B:
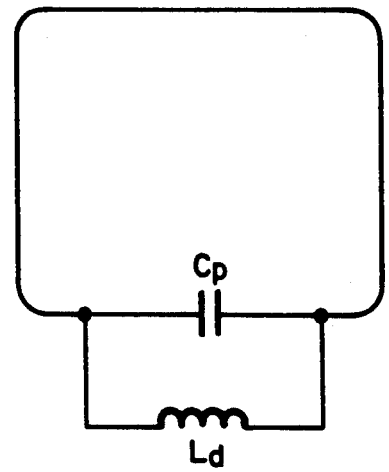
Figure 3C:
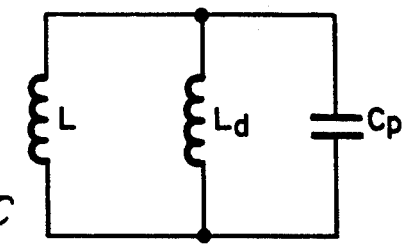
Figure 3E:
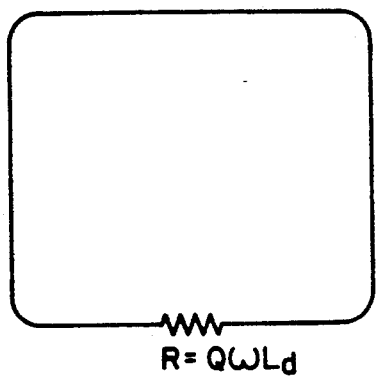
Figure 3D:
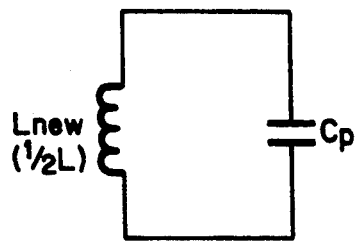

An overall MRI system is depicted in FIG. 1. Here, a conventional MRI system controller 10 is interfaced with an operator control console 12 and with the usual gradient coils 16, MRI RF transmit coil 18 and MRI RF receive coil 20. An image volume 22 exists within this apparatus (to which the static field generator applies a constant field $B_o$) and in which a portion of the patient body 24 to be imaged is disposed.

As depicted in FIG. 1, the NMR RF receive coil 20 may be configured as a "surface" coil which is relatively planar and disposed relatively adjacent the spinal column 26 of patient 24 which is of image interest. In some MRI systems (e.g., cryogenic solenoidal field generator systems), the static $B_o$ field is directed along a z axis (as depicted in FIG. 1) while the desired orientation of transmitted RF magnetic fields is parallel to the x axis and receive RF magnetic fields are parallel to the y axis. Under these conditions, theoretically, there may be little or no coupling between transmit fields and the receive coil and the need for detuning during transmit periods is greatly diminished.

In other systems (e.g., some commercial permanent magnet systems), vertical or 45° orientation of RF transmit fields have been utilized (as also depicted in FIG. 1). Clearly, in both these cases there is a strong transmit field parallel to the received coil field orientation and strongly coupled thereto.

As indicated by the vector F in FIG. 1, some transmitted RF fields are assumed to be linked to the RF receive coil 20. These will naturally then give rise (in accordance Lenz' law) to opposing fields $F_1$. However, by adding a second "cancelling" winding to the RF receive coil 20 in accordance with this invention, a further field $F_2$ can be generated to at least partially cancel induced field $F_1$. In this manner, it is proposed to reduce disturbances to the desired transmitted RF field in the vicinity of receive coil 20 (thus better insuring correct nuclei nutation in the image area of interest).

As exemplary embodiment of RF receive coil 20 is shown in schematic form at FIG. 5. Here, the usual winding L1 and tuning capacitance C1 are depicted. The usual shorting switch SW1 may also be utilized as depicted in dotted lines. However, in addition, a second winding L2 is included in composite coil 20. As shown, this coil L2 is connected to the same pair of RF output terminals 30, 32—and it is physically located so as to be linked to substantially the same space as the first winding L1. However, the terminal connections are reversed for winding L2. Accordingly, induced currents $I_1$ and $I_2$ will flow in opposite senses in these two windings thus generating opposite fields $F_1$ and $F_2$, respectively, which will at least partially cancel so as to provide less ultimate disturbance to the desired transmitted field F.

Since the second or "cancelling" winding L2 is only to be effective during the RF transmit pulses, suitable serially connected switches SW2 and SW3 are provided. Preferably, a pair of such switches is provided and symmetrically located with respect to the RF output terminals 30, 32 and depicted in FIG. 5. Preferably, such switches would be located as close as possible to terminals 30, 32 (to minimize effects during desired receive times on the regular receive winding L1).

A suitable passive form of RF switch for use in this invention is depicted at FIG. 6. Here, a pair of RF diodes D1 and D2 (e.g., type MBD 701) are connected "back-to-back". When relative strong RF transmit fields are linked to coil winding L2, then sufficient voltage will be present across the diodes so as to forward bias them and turn the switch "on" automatically in the presence of such fields. (Such RF switches per se are, of course, well-known in the art.)

A suitable actively controlled RF switch is depicted in FIG. 7. Here, diode D3 (e.g., a PIN diode) is connected with DC blocking capacitors C2, C3 (which are of sufficiently high capacitance to effectively "pass" the RF frequency of interest, e.g., 15 Megahertz). At the same time, suitable DC biasing currents may be connected via radio frequency chokes RFC1 and RFC2 as controlled by the MRI controller so as to forward bias and turn "on" diode D3 during the RF transmission time intervals. (Once again, such RF switches are known per se to those in the art.)

Another exemplary embodiment of this invention is depicted in FIG. 8. Here, only a single serial switch is utilized in the "cancellation" winding L2. It is preferably located symmetrically with respect to the RF output terminals 30, 32 as also depicted in FIG. 8.

A possible physical embodiment of receive coil 20 is depicted in FIG. 9. Here, each winding L1 and L2 is formed from a strip of copper (e.g., approximately 1" wide of suitably rounded corners and about 8" on a side). The windings L1 and L2 are of equal dimensions and are placed one on top of the other with an interspersed layer of insulation 40. RF output terminals 30, 32 are connected adjacent gap 42 in winding L1(across which capacitor C1 and switch SW1 (if used) would also be connected. Switches SW2 and SW3 then interconnect the ends of winding L2 to the same RF output terminals 30, 32—but in an opposite sense to the connection of coil winding L1. The entire composite coil structure 20 may, of course, then be suitably encapsulated as depicted at 44 so as to present a robust and pleasingly aesthetic appearance for use in the MRI system.

As shown in FIGS. 10 and 11, it is not necessary to use a cancelling coil having approximately the same physical dimensions as the receive coil. For example, the cancelling coil (e.g., $L_2'$ in FIG. 10 or $L_2''$ in FIG. 11) may be smaller but have a greater number of turns than the receive coil $L_1$. Since the induced voltage is proportional to the number of turns and area encompassed thereby, various number of turns and turn area(s) and/or orientation(s) can be used as may be desirable for a given installation. A variable resistor and/or reactance circuits may also be added, if desired, to facilitate cancellation (e.g., as depicted in FIG. 11).

While only a few exemplary embodiments of this invention have been described in detail, those skilled in the art will recognize that many variations and modifications of this invention may be made while still retaining many novel and advantageous features. Accordingly, all such modifications and variations are intended to be included within the scope of the appended claims.

What is claimed is:

1. An MRI RF receiving coil for use in an MRI system which transmits NMR RF nutation pulses in the vicinity of the receiving coil, said receiving coil comprising:
   a first winding connected to a pair of RF output terminals to provide induced current of a first sense to said terminals; and
   a second winding connected to said pair of RF output terminals so as to provide induced current of a second sense, opposite said first sense at the output terminal connection and linked to at least a portion of the same space as the firs winding;
   said second winding including at least one RF switch connected in series therewith which is closed during transmission of at least some of said NMR RF nutation pulses and open during reception of NMR RF responses.

2. An MRI receiving coil as in claim 1 wherein said RF switch is a passive switch automatically activated to a closed condition by the presence of sufficiently strong transmitted RF fields.

3. An MRI RF receiving coil as in claim 2 wherein said passive switch comprises a pair of back-to-back connected diodes.

4. An MRI RF receiving coil as in claim 1 wherein said RF switch is disposed symmetrically with respect to said RF output terminals.

5. An MRI RF receiving coil as in claim 1 further comprising at least one further RF switch connected in series with said second winding and also closed during transmission of at least some of said NMR RF nutation pulses and open during reception of NMR RF responses.

6. An MRI receiving coil as in claim 1 wherein said RF switch is an actively controlled switch.

7. An MRI receiving coil as in claim 6 wherein said RF switch comprises a diode with biasing connections controlling it to closed and to open conditions.

8. An MRI RF receiving coil as in claim 7, having at least two RF switches connected in series with said second winding and closed during transmission of at least some of said NMR RF nutation pulses.

9. An MRI RF receiving coil as in claim 8 having two said RF switches, each being disposed substantially adjacent one of said RF output terminals.

10. An MRI RF receiving coil as in claim 9 wherein each said RF switch comprises a pair of back-to-back connected diodes.

11. An MRI RF receiving coil as in claim 1 wherein the coil is a surface coil, each said winding having but a single turn of conductor therein.

12. An MRI receiving coil as in claim 1 wherein said first and second windings are of approximately the same size, shape and number of turns so as to be linked to substantially the same common space.

13. An MRI receiving coil as in claim 1 wherein said first and second windings are of substantially different dimensions.

14. An MRI receiving coil as in claim 13 wherein said second winding is of smaller area than said first winding and wherein said second winding includes a greater number of turns than said first winding.

15. An MRI receiving coil as in claim 1 wherein said second coil includes at least one discrete impedance element serially connected therewith.

* * * * *